United States Patent
Huang et al.

(10) Patent No.: US 6,497,785 B2
(45) Date of Patent: Dec. 24, 2002

(54) WET CHEMICAL PROCESS TANK WITH IMPROVED FLUID CIRCULATION

(75) Inventors: Yi-Chen Huang, Hsin-Chu; Chun-Hsiung Chen, Tainan, both of (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 0 days.

(21) Appl. No.: 09/761,402

(22) Filed: Jan. 16, 2001

(65) Prior Publication Data

US 2002/0092614 A1 Jul. 18, 2002

(51) Int. Cl.$^7$ ................................................ B05C 1/00
(52) U.S. Cl. .................................. 156/345.22; 134/1.3
(58) Field of Search ........................... 156/345, 345.22; 134/1.3; 216/85, 88, 89

(56) References Cited

U.S. PATENT DOCUMENTS

| | | | |
|---|---|---|---|
| 5,698,038 A | * 12/1997 | Guldi et al. | .................... 134/1 |
| 5,817,185 A | * 10/1998 | Shindo et al. | .............. 134/25.4 |
| 5,868,898 A | * 2/1999 | Liu et al. | .................... 156/345 |
| 5,976,311 A | * 11/1999 | Han | ........................... 156/345 |

* cited by examiner

*Primary Examiner*—Gregory Mills
*Assistant Examiner*—Sylvia MacArthur
(74) *Attorney, Agent, or Firm*—Tung & Associates

(57) ABSTRACT

A wet chemical process tank, or a wet etch tank, that has improved fluid circulation and improved uniformity in the fluid concentration in the tank is disclosed. In a preferred embodiment, a tank body is provided which has a liquid dispenser positioned therein with a plurality of liquid outlets in a vertical surface of the dispenser each having a different diameter opening for compensating the different fluid pressure in the dispenser. A more uniform liquid concentration is thus achieved in the tank cavity to perform a more uniform chemical process on the plurality of wafers. The tank body is further provided with a second endwall which has a second distance from the plurality of wafers that is at least twice the first distance between a first endwall and the plurality of wafers. When the second endwall is at least 0.5 cm shorter than the first endwall, the larger second distance together with the shorter height of the second endwall induces a large volume of liquid to overflow the second endwall and to carry away any film residues or flakes, such as that of a photoresist material, from the tank cavity and thus preventing any possible redeposition of the film residues on the wafer surface and any contamination problems.

20 Claims, 2 Drawing Sheets

WET CHEMICAL PROCESS TANK WITH IMPROVED FLUID CIRCULATION

FIELD OF THE INVENTION

The present invention generally relates to a wet chemical process tank that has improved fluid circulation and more particularly, relates to a wet chemical process tank that has improved liquid flow such that flakes of film residues can be effectively carried away from the etch tank.

BACKGROUND OF THE INVENTION

In semiconductor fabrication process, various techniques of etching resist-imaged photomasks, silicon wafers or other semiconductor materials have been used. A set etching technique conducted in an immersion tank is generally a practical high-throughput, flexible fabrication process. By properly selecting etchant chemicals, etch reactions with a target film are thermodynamically favored over reactions with other films. Desirable etch-rate ratios can be usually obtained.

A wet etching method is especially suitable for the blanket etching of materials such as polysilicon, oxide, nitride and metal. The method is capable of providing a desirable etch selectivity, a damage-free interface and particle-contamination-free wafers. In the more recently developed wet etching technology, automated robotic handling systems and ultra-pure chemicals are used to further improve particle control and process consistency. A well-controlled wet etching technique is therefore the choice of etching process in VLSI and ULSI fabrication techniques.

One of the key criteria in carrying out a set etching process is that the etch products must be soluble in the etchant solution and therefore, no contaminating particles are generated. In an immersion etching process, the volume of the etching tank should be large enough to create enough pressure on the wafer surface in order to ensure an accurate balance of the etchant components; to keep the concentration of the etchant relatively constant; and to minimize the number of times the etchant tank must be changed. An etchant bath change creates expensive down time and furthermore, the handling of highly hazardous corrosive materials creates potential safety problems.

Wet etching is a frequently used technique for stripping photoresist films from silicon wafers where the complete removal of resist images without adversely affecting the wafer surface is desired. The resist layer or images should be completely removed without leaving any residues, including contaminant particles that may have been present in the resist. The underlying surface of the photoresist layer should not be adversely affected, for instance, accidental etching of the metal or oxide surface should be avoided. Liquid etchant strippers should produce a reasonable bath yield in order to prevent redeposition of dissolved resist on the wafers. The etchant should completely dissolve the photoresist layer in a chemical reaction, and not just lifting or peeling so as to prevent redeposition. It is also desirable that the etching or stripping time be reasonably short in order to permit high wafer throughput.

Wet etchants such as sulfuric acid ($H_2SO_4$) and mixtures of $H_2SO_4$ with other oxidizing agents such as hydrogen peroxide ($H_2O_2$) are widely used in stripping photoresist or in cleaning a wafer surface after the photoresist has been stripped by other means. For instance, a frequently used mixture is seven parts $H_2SO_4$ to three parts 30% $H_2O_2$ or a mixture of 88% sulfuric acid and 12% nitric acid. Wafers to be stripped can be immersed in the mixture at a temperature between about 100° C. and about 150° C. for 5–10 minutes and then subjected to a thorough rinse of deionized water and dried in dry nitrogen. This type of inorganic resist strippers, such as the sulfuric acid mixtures, is very effective in the residual-free removal of highly postbaked resist. They are more effective than organic strippers and the longer the immersion time, the cleaner and more residue-free wafer surface can be obtained.

In a typical wet chemical process tank, in order to ensure a perfect mix of acid and other components or a good uniformity in the acid itself, constant stirring or agitation of the solution in the tank is desired. While mechanical stirring or agitation techniques have been used, the moving components of a stirrer or agitator frequently generate contaminant particles that are detrimental to the wafer surfaces. Furthermore, a mechanical stirrer or agitating device tends to work only in a localized area of the large chemical tank while leaving a large area of the tank unmixed. Since wafers are usually loaded into a wafer boat and positioned at or near the center of the tank, too vigorous stirring or agitation of the liquid in the tank may cause the wafers in the wafer boat to move and as a result, stick to each other. Such wafer sticking problems result in uneven and unsatisfactory etching on the wafer surfaces.

An improved mixing method for liquids in a wet chemical tank is to force a fluid to enter the wet chemical tank at the bottom of the tank and then forming gas bubbles to rise from the bottom to the top of the tank and thereby carrying out mixing function along the way. The fluid used is normally a substance that readily reacts with the liquid in the tank such that either a gas or a vapor is generated to form the bubbles. One of such suitable chemical reactions occurring between a liquid in a tank and a fluid pumped therein is an acid and water. For instance, when phosphoric acid ($H_3PO_4$) and ionized water are mixed in a tank, water reacts with the strong acid violently and immediately boils to form water vapor in bubbles and then the bubbles rise to the top of the liquid surface in the tank. During the process where the bubbles rise to the top of the liquid surface, the bubbles cause disturbance in the liquid and thus improve its uniformity by the agitation occurring in the liquid. A conventional system of a wet chemical process tank equipped with a fluid dispensing member, which is commonly called a spray bar, positioned at the bottom of the tank is shown in FIG. 1.

FIG. 1 shows a wet chemical process system 10 including a process tank 12 formed by a bottom wall 14 and four sidewalls 16 which are joined perpendicular to the bottom wall 14 forming a fluid-tight enclosure. The bottom wall 14 and the sidewall 16 can be constructed of a corrosion resistant material such as panels of stainless steel or steel panels coated with a corrosion resistant material such as Teflon. Due to the extreme corrosive nature of the processing liquids that are normally used in the wet chemical processing of semiconductor wafers, a securely sealed enclosure is a critical requirement for both maintenance and safety. The size of the tank 12 should be sufficiently large such that, for instance, two wafer boats (not shown) which are capable of holding twenty-four wafers each can be placed in the center of the tank while leaving an adequate space between the wafers and the walls such that a constant movement in the processing liquid can be achieved. Into the wet chemical process tank 12, a fluid dispensing member, or a spray bar 22, is positioned at the bottom of the tank. A plurality of openings 24 are formed on the top surface 26 of the dispensing member 22 for allowing a fluid to enter the tank.

An enlarged, cross-sectional view of the dispensing member 22 taken at an opening 24 is shown in FIG. 1A. An internal fluid passage 28 is provided in dispensing member 22 which is in fluid communication with conduit 32 through a connector 34 and an elbow section 36 in the dispensing members 22. A precision volumetric pump 42 is used to pump a fluid such as deionized water from an inlet 44 through conduit 32 into the fluid passage 28. Since the volume of the deionized water that enters the process tank for reaction with phosphoric acid must be precisely controlled such that just the right amount of bubbles are generated, the pump 42 utilized must be a high precision volumetric pump that is capable of precisely controlling the amount of liquid pumped there through. For instance, into a normal wet chemical process tank of 20-liter capacity that is filled with phosphoric acid, only 40 cubic cm of deionized water should be pumped into the tank per minute. At such precisely controlled flow rate, just the right amount of water vapor in bubbles can be generated to suitably mix the phosphoric acid containing in tank 12.

The fluid dispensing member 22, due to its extended exposure to strong acids when immersed in a tank, must be made of a corrosion-resistant material. A suitable material is Teflon which can be easily machined to provide the internal fluid passage 28 and the openings 24. The connector 34 and the conduit 32 should also be made by a corrosion resistant material due to their prolonged exposure to corrosive liquids.

In a conventional wet chemical process tank, the fluid dispensing member, as shown in FIG. 1, has fluid outlets facing upward for easier exit of the fluid. Since wafer boats are normally positioned at the center of the tank and therefore, directly above the fluid dispensing member and are in the path of the bubbles formed by water vapor exiting the openings in the dispensing member. This can cause various processing problems, for instance, the bubbles can sometimes stick to a wafer surface such that the specific surface area cannot be wetted by the etchant. This can lead to uneven etching of a wafer surface. The rising bubbles can also cause disturbance or movement of the wafers and thus causing the wafers to stick to each other. When the wafer sticking problem occurs, the wafer surfaces which are stuck together are not exposed to etchant solution and thus, poor etching occurs on the surfaces as a result.

An improved conventional system for wet etch that is equipped with an improved liquid dispensing member is shown in FIGS. 2A~2C. In the improved wet etch tank 30, a liquid dispenser member 38 that has fluid outlets 40 facing sideways for avoiding impacting the wafers with an acid flow that is fed through the dispenser 38. The acid flow is fed through an inlet port 46 that is situated at one end of the etch tank 30. A cross-sectional view of the improved wet etcher tank 30 is shown in FIG. 2A, while a plane view and an end view of the same are shown in FIGS. 2B and 2C, respectively.

While the improved wet etcher 30 avoids impacting the wafers directly with the acid flow 48, it does cause other processing difficulties. For instance, since all the fluid outlets, or apertures 40, are provided in the same dimension, i.e. in the same diameter, the flow velocity of acid from the outlets 40 along the longitudinal length of the dispenser 38 is not the same. The outlets 40 that are closer to the fluid inlet port 46 produce higher flow velocities of the acid flow and thus causing a solution concentration adjacent to those outlets higher than the remaining volume of the tank. At the end of the dispenser 38, the flow velocity becomes the smallest and thus produces the lowest concentration of the etch solution. The variation in the concentrations of the etchant solution at different locations in the tank leads to a large non-uniformity in the etch rates achieved on the wafers and a variation in the thicknesses of the material removed.

In the improved wet etching tank 30, the inner tank 50 overflows from flow outlets 52 provided along the top edge of the tank wall 54. The overflow from the inner tank 50 is received by the outer tank 56 which normally has a wall that is 5 cm away from the inner tank wall. However, due to a slow liquid flow rate at the plurality of fluid outlets 52, film contaminants such as flakes 58 of a photoresist film from a photoresist stripping process frequently cumulates at the fluid outlets 52 and cannot be expelled from the tank 30. When a large cumulation of the flakes 58 occurs in the wet etch tank 30, the flakes may redeposit on the wafer surface when the wafers are lifted out of the etch tank 30. This creates a serious contamination problem for the wafers.

It is therefore an object of the present invention to provide a wet chemical process tank with improved fluid circulation that does not have the drawbacks or shortcomings of the conventional wet etch tanks.

It is another object of the present invention to provide a wet chemical process tank that has improved fluid circulation for achieving a more uniform fluid concentration in the tank and a higher overflow rate such that film residues can be carried away from the etch tank.

It is a further object of the present invention to provide a wet chemical process tank that has improved fluid circulation such that redeposition of contaminating film residues on the wafers can be avoided.

It is another further object of the present invention to provide a wet chemical process tank that has improved fluid circulation such that an etchant solution of improved uniformity is achieved in the tank.

It is still another object of the present invention to provide a wet chemical process tank that utilizes a fluid dispenser equipped with outlet apertures having different diameters such that a flow rate differential between the outlets can be minimized.

It is yet another object of the present invention to provide a wet etch tank that has improved liquid flow properties in which a second endwall of the tank is spaced from the wafers at least twice the distance between a first endwall and the wafers for inducing a higher flow rate to carry away any contaminating film residues.

It is still another further object of the present invention to provide a wet etch tank that is equipped with a liquid dispenser that has outlet apertures with diameters that are different by at least 100%.

SUMMARY OF THE INVENTION

In accordance with the present invention, a wet chemical process tank that has improved fluid circulation, more uniform fluid concentration in the tank and a higher flow rate for discharging contaminating film residues is provided.

In a preferred embodiment, a wet chemical process tank that has improved fluid circulation is provided which includes a tank body that has a bottom wall and two sidewalls, a first endwall and a second endwall perpendicularly joined to the bottom wall forming a fluid tight cavity for holding a liquid therein; the cavity is adapted for holding a plurality of semiconductor wafers in an upright position; the first endwall and the two sidewalls are of the same height, while the second endwall is at least 0.5 cm shorter than the first endwall for inducing a liquid flow over the second endwall when liquid enters and overfills the cavity from a liquid inlet positioned juxtaposed to the first endwall; and a liquid dispenser positioned on and supported by the bottom wall of the tank body that has an elongated body and generally rectangular shaped cross-section connected on one end juxtaposed to the first endwall in fluid communication with the liquid inlet, the elongated body has a liquid passageway therein in fluid communication with a plurality of openings provided on a vertical side of the body allowing liquid to exit the body in a horizontal direction, the plurality of openings increases in size from a first opening adjacent to the first endwall to a second opening adjacent to the second endwall by at least 50%.

In the wet chemical process tank that has improved fluid circulation, the tank body may further include an outer tank for accepting an overflow from the cavity of the tank body and for recirculating the overflow into the tank body by a pump means. The liquid may be a diluted acid solution for conducting a wet etch process. The second endwall may be at least 1 cm shorter in height than the first endwall for inducing a liquid flow over the second endwall. The shorter height of the second endwall induces a liquid flow from the first endwall towards the second endwall. The second opening in the plurality of openings may be at least 100% larger than the first opening. A second distance between the second endwall and the plurality of semiconductor wafers may be at least 100% larger than a first distance between the first endwall and the plurality of semiconductor wafers. The bottom wall, the two sidewalls, and the first and second endwalls may be formed with a corrosion-resistant surface. The liquid dispenser may be formed of a corrosion-resistant material. The first opening may have a diameter of about 0.2 cm, while the second opening may have a diameter of about 0.6 cm.

The present invention is further directed to a wet etch tank that has improved liquid flow which includes a tank body that has a bottom wall and two sidewalls, a first endwall and a second endwall perpendicularly joined to the bottom wall forming a fluid-tight cavity for holding a liquid therein; the cavity is adapted for holding a plurality of semiconductor wafers held in an upright position therein; the first endwall and the two sidewalls are of the same height, while the second endwall is at least 0.5 cm shorter than the first endwall for inducing a liquid flow over the second endwall when liquid enters and overfills the cavity from a liquid inlet positioned juxtaposed to the first endwall; the first endwall may be spaced from the plurality of semiconductor wafers at a first distance, while the second endwall may be spaced from the plurality of semiconductor wafers at a second distance, the second distance being at least 2 times the first distance to facilitate the liquid flow over the second endwall and to carry away film residues; and a liquid dispenser positioned on and supported by the bottom wall of the tank body which has an elongated body and generally rectangular shaped cross-section connected on one end juxtaposed to the first endwall in fluid communication with the liquid inlet, the elongated body may have a liquid passageway therein in fluid communication with a plurality of openings provided on a vertical side of the body allowing liquid to exit the body in a horizontal direction, the plurality of openings increases in size from a first opening adjacent to the first endwall to a second opening adjacent to the second endwall by at least 50%.

In the wet etch tank that has improved liquid flow, the tank body may further include an outer tank for accepting an overflow from the cavity of the tank body and for recirculating the overflow into the tank body by a pump means. The liquid may be a diluted acid solution for conducting a wet etch process, or a photoresist stripping process. The second endwall may be at least 1 cm shorter in height than the first endwall for inducing a liquid flow over the second endwall. The shorter height of the second endwall further induces a liquid flow from the first endwall towards the second endwall. The second opening in the plurality of openings may be at least 100% larger than the first opening.

In the wet etch tank that has improved liquid flow, a second distance between the second endwall and the plurality of semiconductor wafers may be at least 3 times larger than a first distance between the first endwall and the plurality of semiconductor wafers. The bottom wall, the two sidewalls, the first endwall and the second endwall may be formed with a corrosion-resistant material, or with a corrosion-resistant surface. The liquid dispenser may be formed of a corrosion-resistant material, such as a corrosion-resistant polymeric material. The second opening may have a diameter that is at least 100% larger than the first opening in the liquid dispenser.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a wet chemical process tank that has improved fluid circulation and improved fluid concentration in the tank.

The present invention wet chemical process tank consists of a tank body that has a first endwall and an opposing second endwall spaced-apart from the first endwall, wherein the second endwall is at least 0.5 cm shorter in height than the first endwall inducing a fluid flow toward the second endwall from the first endwall and a fluid overflow on the second endwall when liquid overfills the cavity in the tank. The tank body may further be constructed such that the second endwall is spaced-apart from the plurality of wafers at a second distance which is at least twice the value of a first distance between the first endwall and the plurality of wafers. The large second distance further induces a higher flow rate of the liquid in the tank toward the second endwall and thus a larger flow of the liquid to carry away any contaminating film residues produced by the wet etching process. For instance, when a photoresist stripping process is conducted, any residual photoresist flakes accumulated on top of the etchant solution can be efficiently carried away by the large flow of the etchant toward the second endwall.

The present invention novel wet chemical process tank further utilizes a liquid dispenser that is positioned on and supported by a bottom wall of the tank body which has a plurality of liquid outlets provided on a vertical side of the dispenser that has different diameter openings with the diameter being largest at the end of the dispenser that is furthest away from the liquid inlet to the dispenser. The diameter openings may be different by at least 50%, and preferably by at least 100% such that the largest fluid outlet is at least 100% larger in diameter than the smallest fluid outlet.

The present invention novel wet chemical process tank provides at least two major benefits. First, a more uniformly mixed etchant solution is achieved in the tank cavity thus producing more consistent etching results on the plurality of wafers in the etch tank. Secondly, a larger flow rate is produced in the tank when etchant overflows into an outer tank such that any contaminating film residues can be carried away by the large flow and thus eliminating any possibility of redeposition of contaminating film residues onto the wafer surface. For instance, in a photoresist stripping process, residual photoresist flakes or films are carried away by the large flow of etchant solution to avoid the redeposition of the photoresist flakes onto the wafer surface.

Figure 3A:
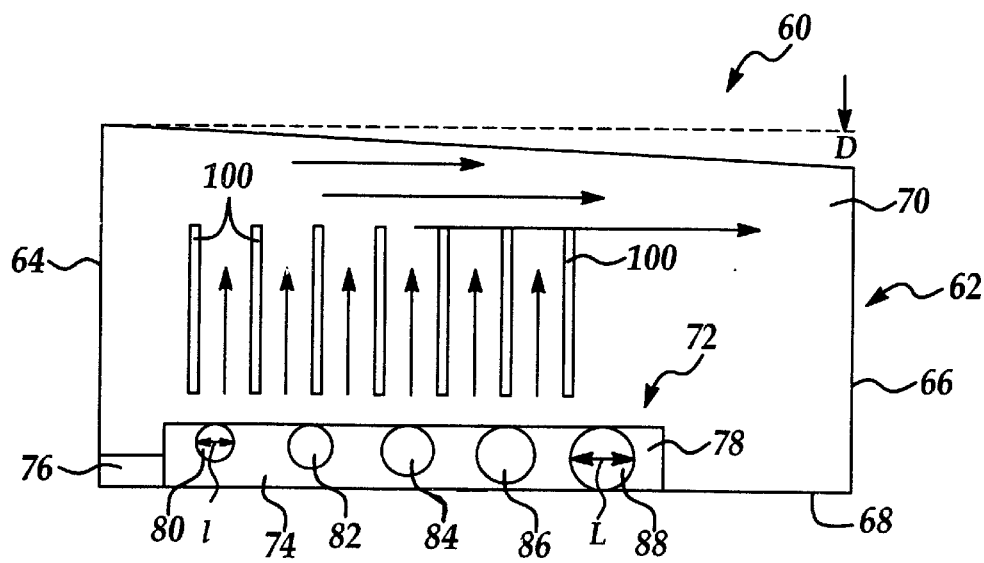
FIG. 3A is a cross-sectional view of a present invention wet chemical process tank provided with a liquid dispenser having liquid outlets in different dimensions and a large second distance between a second endwall and the plurality of wafers.

Referring now to FIG. 3A, wherein a present invention wet chemical process tank 60 is shown. The wet chemical process tank 60 is constructed by a tank body 62 of a first endwall 64, a second endwall 66, two sidewalls (not shown) and a bottom wall 68. Inside a cavity 70 formed by the sidewalls, endwalls 64,66, and bottom wall 68, is positioned a liquid dispenser 72 which is supported by the bottom wall 68. The liquid dispenser 72 is provided generally in a rectangular cross-section with a liquid passageway 74 therethrough for receiving a liquid such as an etchant from the liquid inlet 76. On a vertical side 78 of the dispenser 72, a plurality of liquid outlets 80,82,84,86 and 88 are provided. As shown in FIG. 3A, it is seen that the smallest liquid outlet 80 has a diameter of "l", while the largest liquid outlet 88 has a diameter of "L". The diameters of the liquid outlets 82,84 and 86 fall in-between l and L. The various diametered liquid outlets 80~88 provide a balance for the uneven liquid pressure inside the passageway 74 when a liquid is fed through inlet 76. For instance, at the outlet 80 that is closest to the inlet 76, a smaller diameter outlet is provided such that the flow rate of the liquid is similar to the flow rate of the liquid from the largest diametered outlet 88 to compensate for the lower liquid pressure in the passageway 74 at the vicinity of outlet 88. As a result, approximately equal flow rates of liquid from the liquid outlets 80~88 can be obtained and thus achieving a more uniform liquid concentration in the cavity 70 of the wet chemical process tank 60. This is shown in FIG. 3A by the vertically positioned equal-length arrows. The more uniform concentration of the liquid, i.e. a more uniform etchant solution, produces a more uniform etch result on the wafers that are positioned in the tank cavity 70 adjacent to the liquid outlets 80~88. A significantly improved etching uniformity can thus be obtained when the wet chemical process is a stripping or etching process.

Figure 3B:
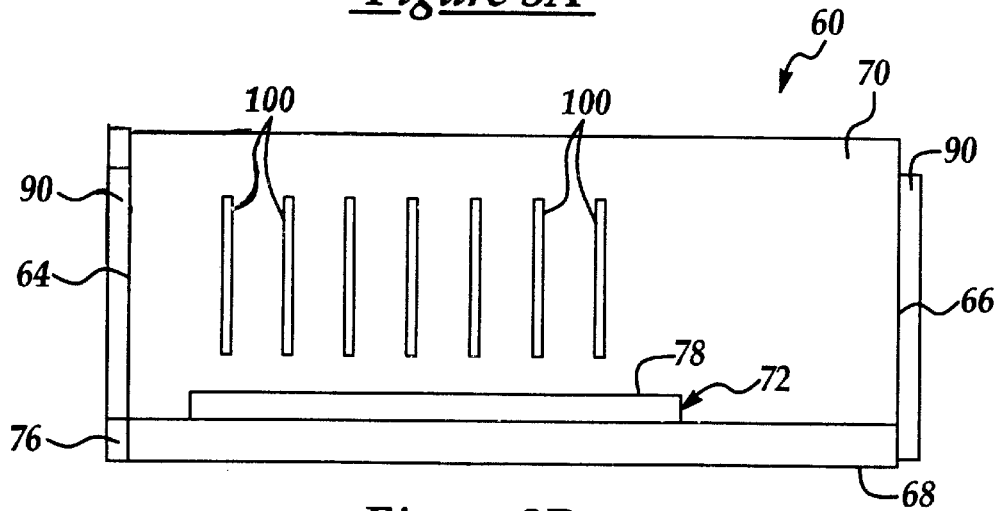
FIG. 3B is a plane view of the present invention wet chemical process tank of FIG. 3A.

FIG. 3B illustrates a plane view of the present invention novel wet chemical process tank 60 of FIG. 3A. It is seen that an outer tank 90 is provided for accepting an overflow of the liquid from the inner tank cavity 70. For instance, as shown in FIG. 3A, the second endwall 66, is at least 0.5 cm smaller in height than the first endwall 66, and preferably at least 1 cm smaller. This is indicated by "D" in FIG. 3A. The shorter height of the second endwall 66 promotes an overflow on top of the second endwall 66 into the outer tank cavity 90, and further induces a liquid flow from the first endwall 64 toward the second endwall 66.

Figure 1:
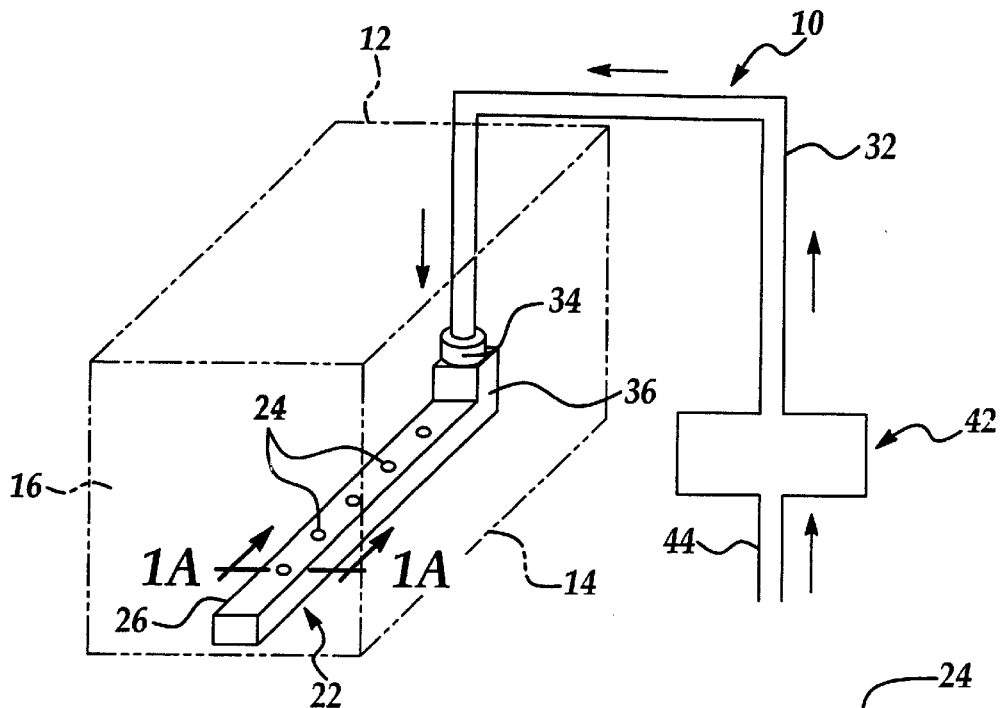
FIGS. 1–1A are graphs illustrating a conventional wet chemical process tank with a liquid dispenser provided on a bottom of the tank.
Figure 1A:
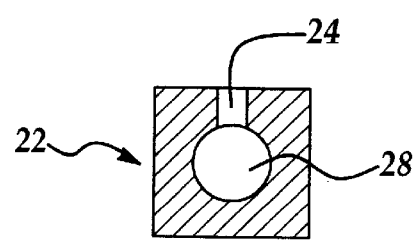
Figure 2A:
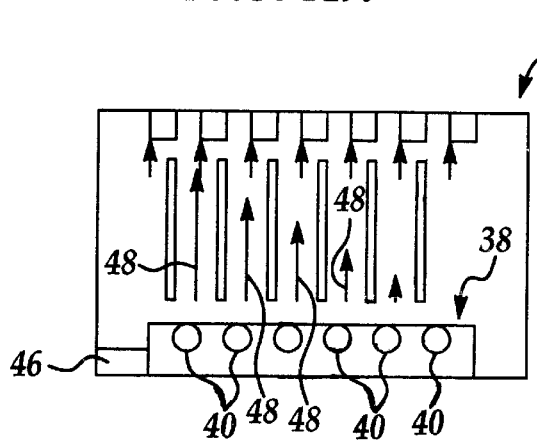
FIG. 2A is a cross-sectional view of an improved conventional wet chemical process tank wherein fluid outlets are provided on the vertical side of a fluid dispenser.
Figure 2B:
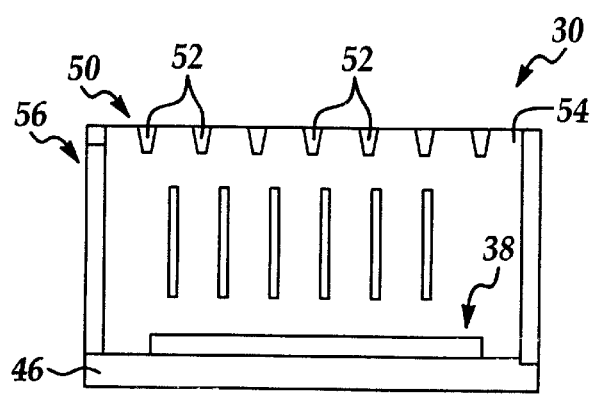
FIG. 2B is a plane view of the improved conventional wet chemical process tank of FIG. 2A.
Figure 2C:
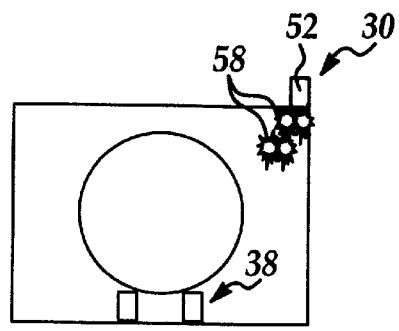
FIG. 2C is an end view of the improved conventional wet chemical process tank of FIG. 2A.

Another novel aspect of the present invention, as shown in FIGS. 3A and 3B, is that the second distance between the second endwall 66 and the plurality of wafers 100 is at least twice, and preferably three times, the distance between the first endwall 64 and the plurality of wafers 100. The larger space toward the second endwall 66 promotes a larger flow rate, i.e. a larger volume of liquid to flow over the top of the second endwall 66. The larger flow rate and thus the larger volume of flow prevents any cumulation of film residues or flakes in the tank cavity, since the flakes are easily carried away by the large liquid flow. The film residues 58, shown in FIG. 2C, is thus carried away from the tank cavity 70 to prevent any contaminating film redeposition on the wafer surface.

The present invention novel wet chemical process tank that has improved fluid circulation and improved uniformity in the fluid concentration has therefore been amply described in the above description and in the appended drawings of FIGS. 3A and 3B.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A wet chemical process tank having improved fluid circulation comprising:

a tank body having a bottom wall and two sidewalls, a first endwall and a second endwall perpendicularly joined to said bottom wall forming a fluid-tight cavity for holding a liquid therein; said cavity adapted for holding a plurality of semiconductor wafers in an upright position therein; said first endwall and said two sidewalls being of the same height, while said second endwall being at least 0.5 cm shorter than said first endwall for inducing a liquid flow over said second endwall when said liquid enters and overfills said cavity from a liquid inlet positioned juxtaposed to said first endwall; and a liquid dispenser positioned on and supported by said bottom wall of the tank body having an elongated body and generally rectangular shaped cross-section connected on one end juxtaposed to said first endwall in fluid communication with said liquid inlet, said elongated body having a liquid passageway therein in fluid communication with a plurality of openings provided on a vertical side of the body allowing liquid to exit the body in a horizontal direction, said plurality of openings increases in size from a first opening adjacent to said first endwall to a second opening adjacent to said second endwall by at least 50%.

2. A wet chemical process tank having improved fluid circulation according to claim 1, wherein said tank body further comprises an outer tank for accepting an overflow from said cavity of the tank body and for recirculating said overflow into said tank body by a pump means.

3. A wet chemical process tank having improved fluid circulation according to claim 1, wherein said liquid is a diluted acid solution for conducting a wet etch process.

4. A wet chemical process tank having improved fluid circulation according to claim 1, wherein said second endwall being at least 1 cm shorter in height than said first endwall for inducing a liquid flow over said second endwall.

5. A wet chemical process tank having improved fluid circulation according to claim 1, wherein said shorter height of said second endwall induces a liquid flow from said first endwall towards said second endwall.

6. A wet chemical process tank having improved fluid circulation according to claim 1, wherein said second opening in said plurality of openings being at least 100% larger than said first opening.

7. A wet chemical process tank having improved fluid circulation according to claim 1, wherein a second spacing between said second endwall and said plurality of semiconductor wafers being at least 100% larger than a first spacing between said first endwall and said plurality of semiconductor wafers.

8. A wet chemical process tank having improved fluid circulation according to claim 1, wherein said bottom wall, said two sidewalls, said first endwall and said second endwall are formed with a corrosion-resistant surface.

9. A wet chemical process tank having improved fluid circulation according to claim 1, wherein said liquid dispenser being formed of a corrosion-resistant material.

10. A wet chemical process tank having improved fluid circulation according to claim 1, wherein said first opening has a diameter of about 0.2 cm, while said second opening has a diameter of about 0.6 cm.

11. A wet etch tank with improved liquid flow comprising:
a tank body having a bottom wall and two sidewalls, a first endwall and a second endwall perpendicularly joined to said bottom wall forming a fluid-tight cavity for holding a liquid therein; said cavity adapted for holding a plurality of semiconductor wafers in an upright position therein; said first endwall and said two sidewalls being of the same height, while said second endwall being at least 0.5 cm shorter than said first endwall for inducing a liquid flow over said second endwall when said liquid enters and overfills said cavity from a liquid inlet positioned juxtaposed to said first endwall, said first endwall being spaced from said plurality of semiconductor wafers at a first distance, said second endwall being spaced from said plurality of semiconductor wafers at a second distance, said second distance being at least two times said first distance to facilitate said liquid flow over said second endwall and to carry away film residues; and a liquid dispenser positioned on and supported by said bottom wall of the tank body having an elongated body and generally rectangular shaped cross-section connected on one end juxtaposed to said first endwall in fluid communication with said liquid inlet, said elongated body having a liquid passageway therein in fluid communication with a plurality of openings provided on a vertical side of the body allowing liquid to exit the body in a horizontal direction, said plurality of openings increases in size from a first opening adjacent to said first endwall to a second opening adjacent to said second endwall by at least 50%.

12. A wet etch tank with improved liquid flow according to claim 11, wherein said tank body further comprises an outer tank for accepting an overflow from said cavity of the tank body and for recirculating said overflow into said tank body by a pump means.

13. A wet etch tank with improved liquid flow according to claim 11, wherein said liquid is a diluted acid solution for conducting a wet etch process.

14. A wet etch tank with improved liquid flow according to claim 11, wherein said second endwall being at least 1 cm shorter in height than said first endwall for inducing a liquid flow over said second endwall.

15. A wet etch tank with improved liquid flow according to claim 11, wherein said shorter height of said second endwall induces a liquid flow from said first endwall towards said second endwall.

16. A wet etch tank with improved liquid flow according to claim 11, wherein said second opening in said plurality of openings being at least 100% larger than said first opening.

17. A wet etch tank with improved liquid flow according to claim 11, wherein a second distance between said second endwall and said plurality of semiconductor wafers being at least three times larger than a first distance between said first endwall and said plurality of semiconductor wafers.

18. A wet etch tank with improved liquid flow according to claim 11, wherein said bottom wall, said two sidewalls, said first endwall and said second endwall are formed with a corrosion-resistant surface.

19. A wet etch tank with improved liquid flow according to claim 11, wherein said liquid dispenser being formed of a corrosion-resistant material.

20. A wet etch tank with improved liquid flow according to claim 11, wherein said second opening has a diameter at least 100% larger than said first opening.

* * * * *